(12) United States Patent
Müller

(10) Patent No.: US 7,298,811 B2
(45) Date of Patent: Nov. 20, 2007

(54) SYNCHRONOUS FREQUENCY DIVIDERS AND COMPONENTS THEREFOR

(75) Inventor: Bardo Müller, Dreieich (DE)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/343,234

(22) Filed: Jan. 31, 2006

(65) Prior Publication Data

US 2006/0170464 A1    Aug. 3, 2006

Related U.S. Application Data

(63) Continuation of application No. PCT/EP03/09564, filed on Aug. 28, 2003.

(51) Int. Cl.
*H03B 19/00* (2006.01)
*G06F 7/68* (2006.01)

(52) U.S. Cl. .................. 377/126; 327/117; 327/202

(58) Field of Classification Search ............... 377/122, 377/126, 115, 117, 47; 327/115, 117, 202
See application file for complete search history.

(56) References Cited

U.S. PATENT DOCUMENTS

| 4,258,273 A | 3/1981 | Straznicky et al. |
| 4,656,649 A | 4/1987 | Takahashi |
| 5,714,896 A * | 2/1998 | Nakagawa et al. ......... 327/115 |
| 5,719,798 A * | 2/1998 | Lutz et al. ................... 708/103 |

FOREIGN PATENT DOCUMENTS

EP    0 473 251 A    3/1992

OTHER PUBLICATIONS

T. Mathew et al; 2-Bit Adder Carry and Sum Logic Circuits Clocking at 19 GHz Clock Frequency in Transfered Substrate HBT Technology; Conference Proceedings; 2001 International Conference on Indium Phosphide and Related Materials; IPRM; Nara, Japan; May 14-18, 2001; *International Conference on Indium Phosphide and Related Materials*; New York, New York; IEEE; US; vol. conf. 13; May 14, 2001; pp. 505-508; XP010547086.

A. J. Acosta et al; Design and Characterization of a CMOS VLSI Self-Timed Multiplier Architecture Based on a Bit-Level Pipelined-Array Structure; IEE Proceedings: *Circuits Devices and Systems;* Institution of Electrical Engineers; Stenvenage, GB; vol. 145; No. 4; Aug. 5, 1998; pp. 247-253; XP006010781; ISSN:1350-2409.

* cited by examiner

*Primary Examiner*—Dinh T. Le
(74) *Attorney, Agent, or Firm*—Arent Fox PLLC

(57) ABSTRACT

The invention discloses a frequency divider using half-adding functions, comprising one latch circuitry with half adding function for each digit, each latch circuitry receiving its output signal Sout at its S-input, the latch circuitry (76) for the least significant bit receiving at its Carry-input a "1", and each further latch circuity receiving at its Carry-input the carry signal from the latch circuitry of the previous digit, and an And gate circuitry receiving the Sum outputs of the latch circuitries.

7 Claims, 4 Drawing Sheets

SYNCHRONOUS FREQUENCY DIVIDERS AND COMPONENTS THEREFOR

This nonprovisional application is a continuation application of and claims the benefit of International Application No. PCT/EP2003/009564 filed on Aug. 28, 2003. The disclosure of the prior application is hereby incorporated herein in its entirety by reference.

The present invention relates to components for synchronous frequency dividers based on half adders and to synchronous frequency dividers based on half adders.

A digital frequency divider, also called a modulo-K counter, produces an output pulse every K input pulses. Depending on the application, it is also desirable to have a wide programming range, e.g. 10-127 for which one needs an N=7 bit counter.

Because of the required high-speed operation, the design must be of the synchronous type, i.e. allowing only transitions on either the falling or the rising edge of the input signal. There are two sources for critical delay in conventional frequency dividers:

One source of delay is the necessary simultaneous comparison of two N-bit numbers in order to detect the end of the counting cycle. If the counter is of the reset/count-to-K type, a complex logic of N XOR gates followed by an AND gate with fan-in N is required. A high fan-in increases the delay of most digital gates. Alternatively, if the counter is of the preset-to-K/count-to-0 type, the counter bits will settle to 0 from the MSB (Most Significant Bit) to the LSB (Lowest Significant Bit). This successive settling allows a cascaded comparison for the end-of-cycle detection, avoiding the high fan-in and thus reducing the critical path, which delimits the maximum operational speed of the circuit.

The other source of delay for the critical path in synchronous counters is the generation of the toggle condition: e.g. a bit is allowed to flip only if all lower bits are 1, realized by a logic circuitry of AND gates with fan-in of 1–n.

Another way to eliminate the N-bit comparison and the generation of the toggle condition is by using an accumulator design, i.e. N-bit full adders with constant increment of 1.

Clearly, the generation of the toggle condition is now transformed into that of generating the carry bits. But circuit complexity for parallel carry generation (like carry look ahead) grows exponentially with the number of bits.

Figure 2:
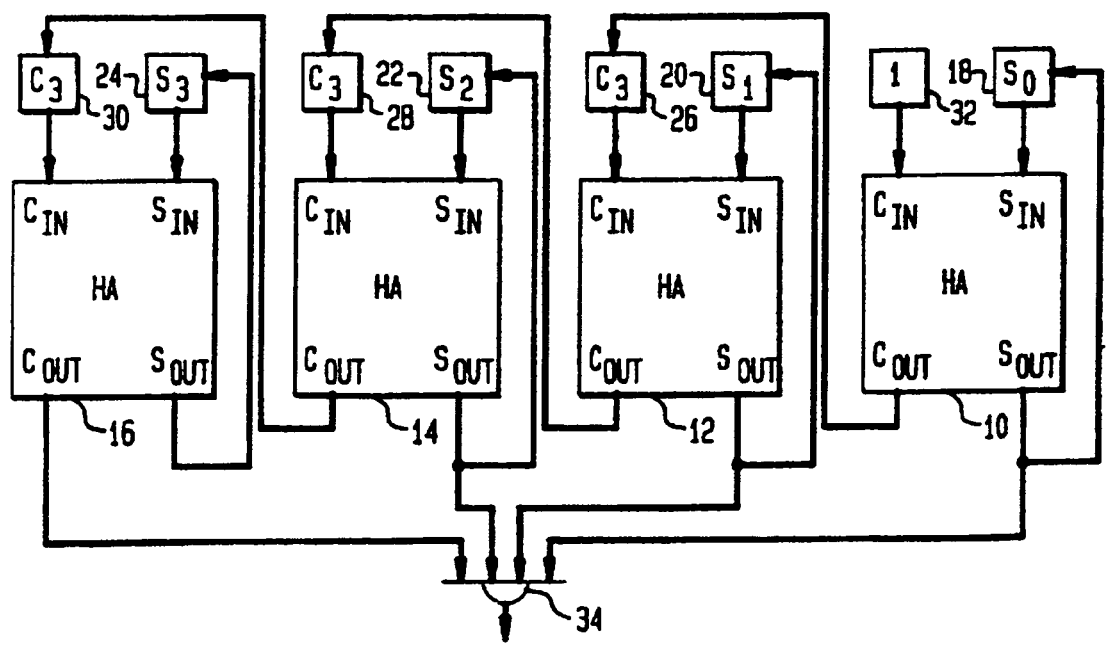

U.S. Pat. No. 5,179,798 Lutz et al provides a modulo-k counter or frequency divider that produces an output pulse for every k clock pulses. The counter of FIG. 2 is a synchronous counter since the latches transfer their inputs to their outputs when they receive the clock pulse. As a result, the input clock pulse (which is not shown in the diagram) causes all of the half adders to generate their sum bits S and carry bits C simultaneously.

In their implementation, the preset value is set to the negative (one's complement) of K and incremented to "1", which corresponds to all bits equal 1 (1111111). Again, as with other preset/count-down types, the MSBs settle first, down to LSB, which allows a fast, cascaded test.

As explicitly stated in said U.S. Pat. No. 5,179,798, the counter is programmable and synchronous, and it is much faster than any other known programmable frequency divider and its period is lower bounded by the sum of the delays due to a latch, a half adder, and an n-input AND gate.

Figure 1:
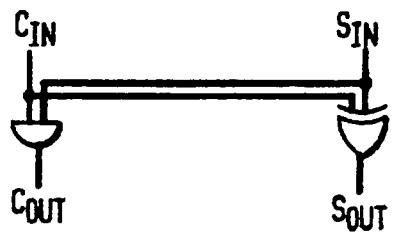
Figure 3:
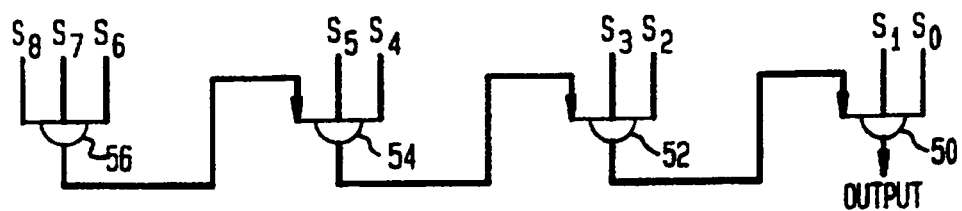

With regards to notation of FIGS. 1 to 3, lower case letters are used to represent numbers and upper case is used to represent sent n-bit words. The subscripted lower case letters represent bits. The meaning of other symbols are given in Table 1. In addition, it should be noted that the lower order bit in a word is bit 0.

TABLE 1

| Symbol | Meaning |
| --- | --- |
| ∩ | bitwise and |
| ∪ | bitwise or |
| ⊕ | bitwise exclusive-or |
| $\bar{x}_i$ | not $x_i$ |
| $\overline{X}$ | one's complement of X |

An n-bit half adder consists of n independent half adders. It takes two n-bit two's complement numbers as inputs, and produces two outputs: an n-bit sum and an n-bit carry. Let $X=x_{n-1} \ldots x_1, x_0$, and $Y=y_{n-1} \ldots y_1, y_0$ be n-bit words with low order bits $x_0$ and $y_0$. An n-bit half adder produces a carry word $C=c_{n-1} \ldots c_1, c_0$ and a sum word $S=s_{n-1} \ldots s_1, s_0$ such that $$C_i = X_{i-1} \cap Y_{i-1} \tag{2}$$

$$S_i = X_i \oplus Y_i$$

Note that $c_0$ is always 0, and that $$C+S=X+Y \text{ (modulo } 2^n\text{)} \tag{2a}$$

The high order carry bit $c_n$ is not part of C, but is sometimes useful as part of a larger calculation.

(C,S) is in half-adder form (or h-a form) if there exist X and Y satisfying equation 2. We write (C,S)=ha(X,Y).

A number in half-adder form is represented by the C or carry component and the S or sum component: the actual value of the counter is not calculated, but given only implicitly by the sum of the numbers in the S and C registers.

With regard to the C and S components, it should be noted that $$C+S=-1 \Leftrightarrow S=-1 \tag{3}$$

With regard to relationship 3, the definition of a two's complement number shows that $X+Y=-1 \Leftrightarrow Y=\overline{X}$. Then according to equation 2, $S=X \oplus \overline{X}=-1$.

As a result, S consists of all ones. A quick examination of equations 1 and 2 shows that only one of $c_i$ and $s_{i-1}$ can be set(=1) for i=1, ..., n−1, as a result, when C+S=−1, C=0 and S=−1.

FIG. 2 illustrates a programmable modulo-k counter using half-adders such as the half-adder illustrated in FIG. 1. Half-adders 10, 12, 14 and 16 are well known in the art. The S out-put of half-adders 10, 12, 14 and 16 are stored by latches 18, 20, 22 and 24, respectively. The outputs of clocked latches 18, 20, 22 and 24 are fed to the S input of half-adders 10, 12, 15 and 16, respectively. The carryout outputs of half-adders 10, 12, and 14 are fed to clocked latches 26, 28 and 30, respectively. Latch 32 is fed a logical 1. The latches may be implemented using registers or D type latches. The outputs of latches 32, 26, 28 and 30 are fed to the carry input of half-adders 10, 12, 14 and 16, respectively. The S outputs of the half-adders are fed to AND gate 34, which provides the divided frequency pulse as output.

Generally, the half-adders and their associated latches can be thought of as an incrementer and the AND gate 34 can be thought of as a detector that detects when S=−1.

FIG. 2 is a programmable modulo-k counter based on relationship 3. Initially, (C,S) is set to (0,k). At each input clock pulse (the clock input is not shown), the sum in (C,S) increases by one because of the 1 that is input to the least order half adder. Since the increment value is 1 the incrementer itself can be constructed out of half adders, and (C,S) is always in h-a form. After k input pulses C+S=−1, and by relationship 3, all of the bits of S will be 1. This reduces the detector to an n-input AND of the bits of S. Note that the 1 that is input to the least order half adder is not part of C. By definition, $c_0$=0, and since a 0 has so effect on the sum, there is no need to use it as an input to the half adder. The place where $c_0$ would have been input is a convenient spot to place a 1 to cause the sum to increase on every pulse.

It is an object of the invention to provide advantageous components for building synchronous frequency dividers based on half adders. More specifically, it is an object of the invention to provide latches which perform further functions useful for constructing structing such frequency dividers.

This object is achieved by a latch circuitry comprising:

a first and a second clocked master-slave latch, each master latch having two OR-wired signal inputs and one clock in-put, the first slave latch having one signal input and a Clk input, the second slave latch having two OR-wired signal in-puts and a clock input, one signal input being connected with the inverting output of the first master latch and the other signal input being connected with the inverting output of the second master latch.

This latch circuitry is apt to perform the latching of a carry-signal and a sum-signal, as they are used in frequency dividers based on half-adders.

At the same time, such a latching circuitry performs a half-adding function. Both master-slave circuits work in parallel. Therefore, the delay caused by such a latching circuitry is as small as the delay caused by a single master-slave latch.

However, due to the OR-wired inputs D1 and D2 and the way they are connected, such a latch circuitry, while latching the carry-signal and the sum-signal, they simultaneously perform a half-adding function. Such a latch circuitry performs the same functions as e.g. latches 20, 26 and the half-adder 12 in FIG. 2. However, each pair of latches and half-adder in FIG. 2 have a composite delay consisting of the delay caused by the latches and the delay caused by the half-adders.

The latch circuitry according to the invention, on the other hand, has only a delay as small as the delay of a master-slave latch.

According to a further embodiment, the OR-wired inputs of the first master latch receive the signals XCin and Xsin, resp. and the inputs of the second master latch receive the signals Cin and Sin, resp. In this case the first slave outputs the signals XCout and Cout, the second slave outputs the signals XSout and Sout.

Further, it is an object of the present invention to provide a fast frequency divider based on half-adding functions.

This object is achieved by a frequency divider using half-adding functions, comprising one latch circuitry with half adding function for each digit, each latch circuitry receiving its output signal at its S-input, the latch circuitry for the least significant bit receiving at its Carry-input a "1", and each further latch circuity receiving at its Carry-input (Cin) the carry signal from the latch circuitry of the previous digit, and an And gate circuitry receiving the Sum outputs of the latch circuitries.

This frequency divider performs the same function as the prior art frequency divider described above in connection with FIGS. 1 to 3, however, it is faster. According to said prior art the Cm and Sin inputs are individually latched before being fed to the AND gate of the half-adder, for generation of the carry Cout and to the XOR gate of the half-adder, for the generation of the sum Sout. These two steps cause two delays, the delay caused by the latch and in addition the delay caused by the half-adder.

The frequency divider according to the present invention, however, has the half-adding function merged in its specific latch circuitry. Therefore, no extra delay is caused by performing the half-adding function.

The invention yields the advantage that the period of its frequency divider is lower bounded by the delay of the latching circuitry and the delay of the AND gate circuitry. In other words, it is faster than the prior art frequency dividers.

According to a specific embodiment of the invention each latch circuitry comprises:

a first and a second clocked master-slave latch, each master latch having two OR-wired signal inputs and one clock in-put, the first slave latch having one signal input and a clock input, the second slave latch having two OR-wired signal inputs and a clock input, one signal input being connected with the inverting output of the first master latch and the other signal input being connected with the inverting output of the second master latch.

As described above, these latch circuits have been connected to perform a half-adding function which causes no extra delay.

This advantage has been achieved by merging the half-adding function into the logic of the latches.

Further this new frequency divider has the advantage that it can be economically produced because it needs fewer components, as will be made clear later.

Figure 4:
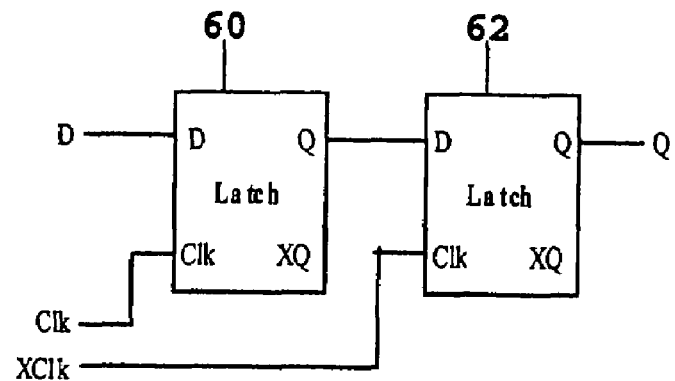
Figure 5:
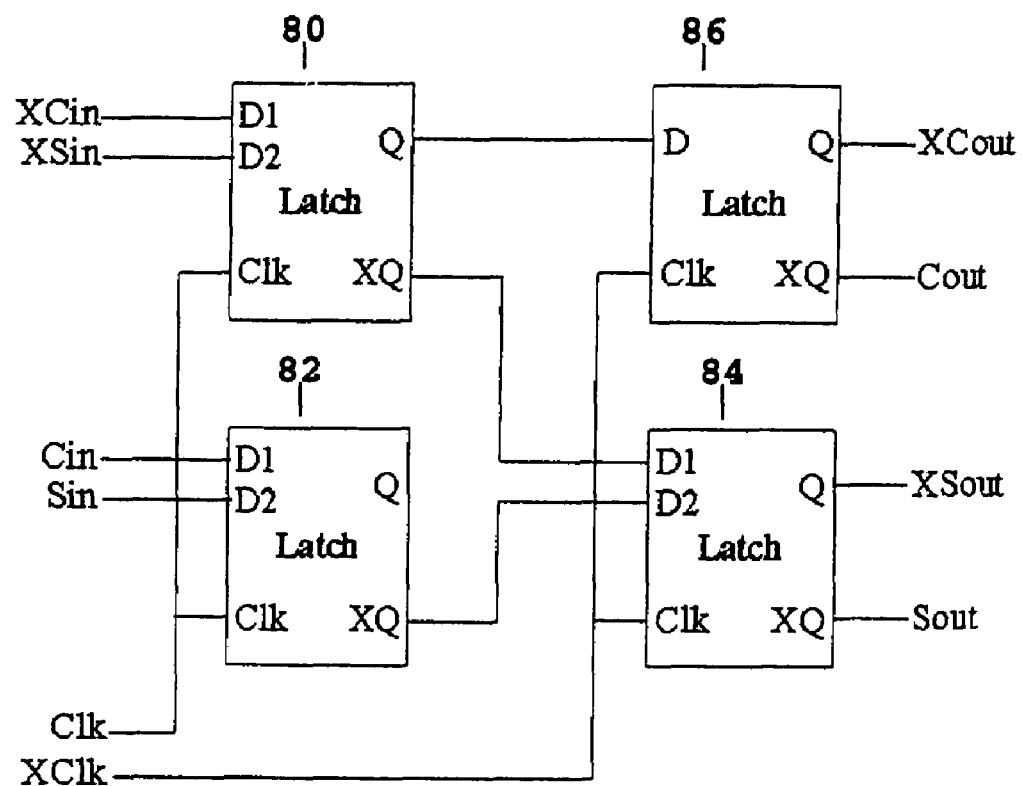
Figure 6:
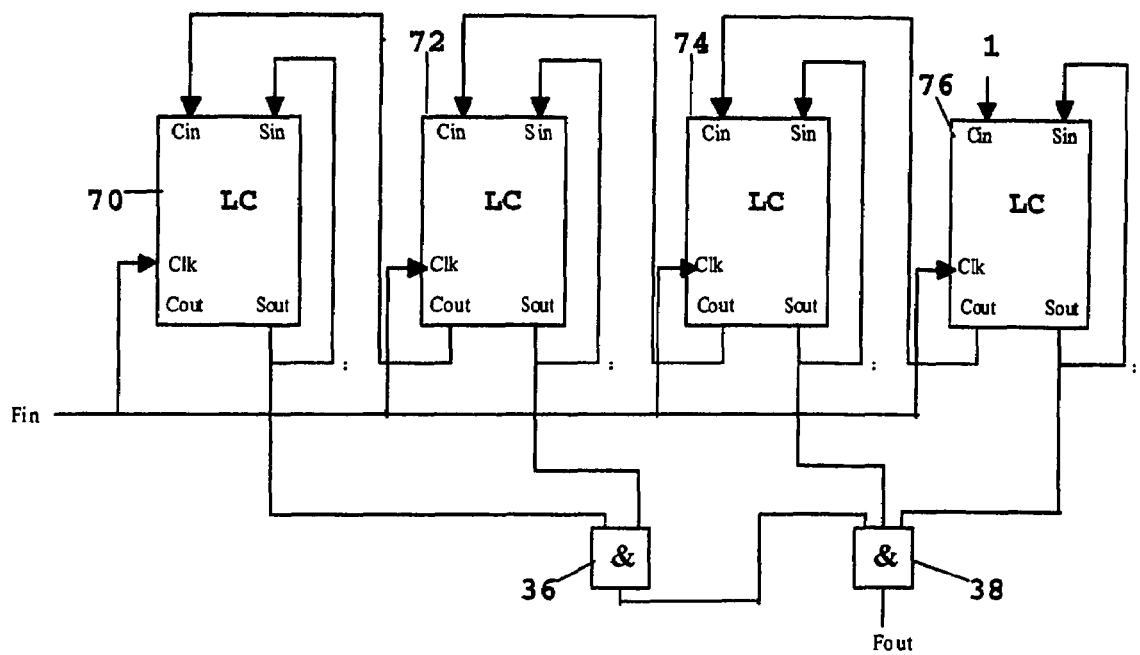
Figure 7:
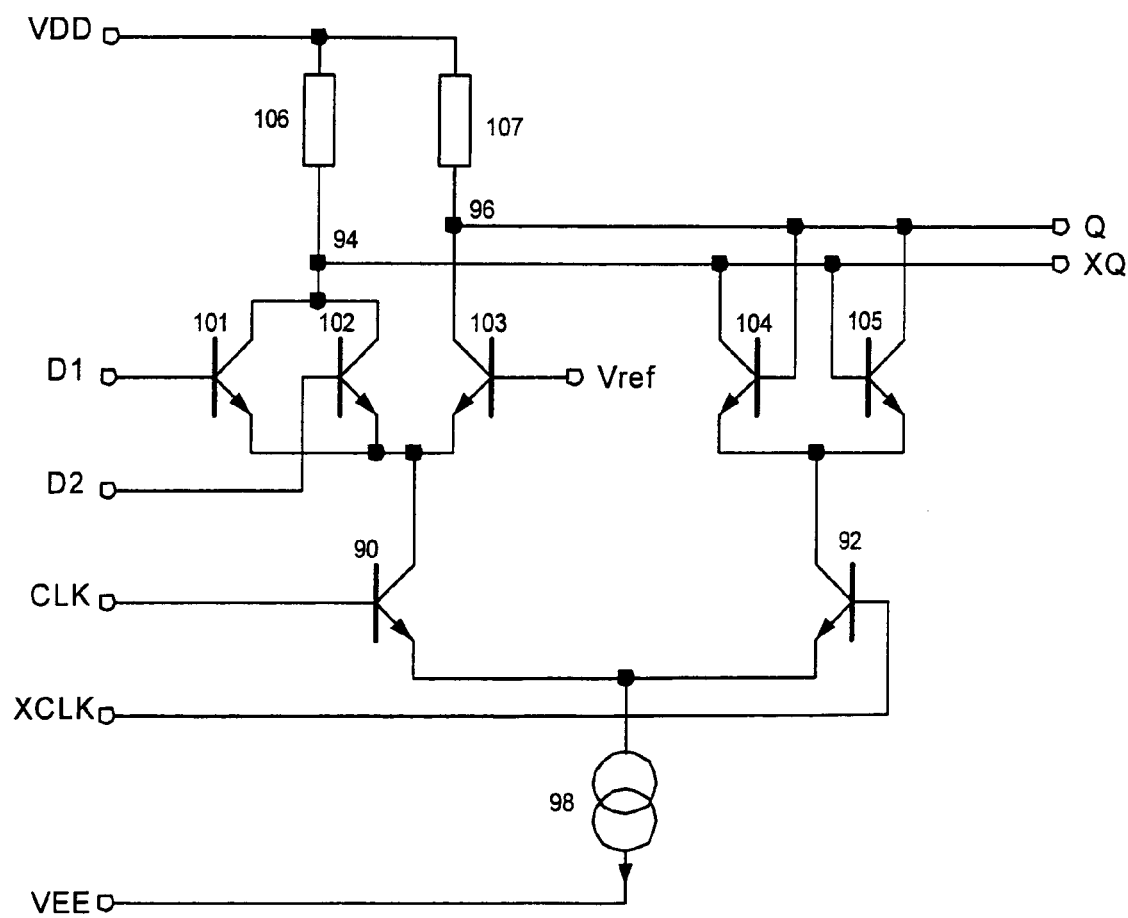

Other objects and further features of the present invention will be apparent from the following detailed description when read in conjunction with the accompanying drawings, in which:

FIG. 1 shows a prior art half adder,

FIG. 2 shows a prior art programmable 4-bit synchronous modulo-k counter based on half adders, FIG. 3 shows a cascaded version of the end-of-cycle detector for a 7-bit modulo-k counter, FIG. 4 shows a master-slave DFF built from simple latches, FIG. 5 shows a clocked latch circuitry with merged half-adding input logic, FIG. 6 shows a programmable 4-bit synchronous modulo-k counter according to the present invention using latch circuitries with merged half-adding function, FIG. 7 shows an implementation of a simple latch with merged input logic (D1 OR D2).

FIGS. 1 to 3 have been described above.

FIG. 4 shows a master-slave latch built from simple latches. The simple latch either stores the data D (clock CLK is high) or directly outputs it to the output Q (CLK is low). Because of the latter function, this simple latch is also called a transparent latch.

In a master-slave latch, two simple latches are connected in series. The first simple latch 60 is called master; the second latch 62 is called slave. The slave latch is operated with the inverted clock of the master latch. In FIG. 4 and the following, an inverted signal is shown by a prefix X.

The master-slave latch inputs the data D, which exist when the clock has its transition from low to high. Likewise, the slave latch becomes transparent when CLK changes from high to low. Thus, outputs change only on the falling edge of CLK.

FIG. 5 shows two master slave latches, which are arranged substantially in parallel. The upper DFF consists of a master 80 and a slave 86. The master has two inputs D1 and D2, which receive the signals XCin, and XSin resp. The other input of master 80 receives the clock Clk.

The Q-output of the latch 80 outputs the latched signal XCin OR XSin. This output signal is input to the entrance D of the slave 86.

The lower master slave latch consists of a master 82 and a slave 84. Again, master 82 has two OR-inputs D1 and D2, which receive the signals Cin and Sin respectively. The other input receives the clock.

The Q-output of master 82 is not being used.

The inverted output XQ is being fed to an OR input D2 of slave 84. The other OR input D1 of slave 84 is connected to the XQ output of the master 80 of the upper master-slave latch. This in-put D1 of slave 84 receives the inverted value of Q which is identical to NOT(XGin+XSin). The output Q of slave 84 out-puts the signal XSout. The inverted output XQ outputs the signal South, which can also be described by (NOT(XCin+XSin)+NOT(Gin+Sin)), which is equal to Cm XOR Sin.

As far as slave 86 is concerned, its output Q outputs the signal XCout. Its inverted output XQ outputs the signal Cout, which can also be described as NOT(XCin+XSin) which is equal to Cin AND Sin.

FIG. 6 shows a four-bit programmable synchronous counter. It comprises four clocked latch circuitries each built up like the clocked latch circuitry shown in FIG. 5. The right-hand side latch circuitry 76 represents the least significant bit (LSB) The clocked latch circuitry 70 at the far-left side represents the most significant bit (MSB). The Cin input of the clocked latch circuitry 76 receives a "1" with every clock.

The Sin input of the latch circuitries 74 to 76 receives the Sout output of this very same latch circuitry. The signal out-put from the output Cout is fed to the input Cin of the latch circuitry 74 of the next higher bit position.

The Sin input of the latch circuitries 70 to 76 receives the Sout output of this very same latch circuitry. The signal out-put from the output Cout of the latch circuitry 76, 74, 72 is fed to the input Cin of the latch circuitry 74, 72, 70 of the next higher bit position.

Again, with every clock the signal output from the Cout output is fed to the clock input of the next higher order clocked latch circuitry, in the present case of the clocked latch circuitry.

The clock to all LCs is fed from Fin.

The Sout output signals of each of the clocked latch circuitry are being fed into cascaded AND circuits 36 and 38. The AND gate 36 receives the Sout output signal from the clocked latch circuitry 70 and 72 and the AND gate 38 receives the output signal from AND gate 36 and the output signals Sout from the clocked latch circuitry 74 and 76. The result is outputted from AND gate 38 as signal Fout.

This counter described in connection with FIG. 6 performs the identical function as the counter of the prior art as described in connection with FIG. 2.

The advantage of the counter to the present invention is that it does not use any extra time for performing the half-adding function. There is no additional delay as there always is with all other known counters built up with half-adders.

In addition to the features of the frequency divider of FIG. 2, this frequency divider shows the line Fin that represents the input clock.

Further, instead of the parallel end-of-cycle detector consisting of a 4-input AND gate 34, there is shown the cascaded AND built from a 2-input AND gate 36 and a 3-input AND gate 38.

As shown in the example below, in the last counting step, the last two bits S0 to S1 change simultaneously from 0 to 1, while the higher significant bits have already settled to 1. So only AND 50 in FIG. 3 and AND 38 in FIG. 5 have to have a fan-in of 3.

EXAMPLE OF OPERATION $K = 5$

Initialize $S = NOT(k) = NOT(0101) = 1010$ $C = 0000$

Iterate:

$$C(i)_n = \begin{cases} S(0)_{n-1} & \text{for } i = 0 \\ C(i-1)_{n-1} \text{ XOR } S(i)_{n-1} & \text{for } i > 0 \end{cases}$$

$$S(i)_n = \begin{cases} \overline{S(i)}_{n-1} & \text{for } i = 0 \\ C(i-1)_{n-1} \text{ AND } S(i)_{n-1} & \text{for } i > 0 \end{cases}$$

Stop/Reload:

if $S = -1(1111$ in two's complement form)

| n | C3 | C2 | C1 | C0 | S3 | S2 | S1 | S0 |
|---|----|----|----|----|----|----|----|----|
| 0 | 0  | 0  | 0  | 0  | 1  | 0  | 1  | 0  |
| 1 | 0  | 0  | 0  | 0  | 1  | 0  | 1  | 1  |
| 2 | 0  | 0  | 0  | 1  | 1  | 0  | 1  | 0  |
| 3 | 0  | 0  | 1  | 0  | 1  | 0  | 0  | 1  |
| 4 | 0  | 0  | 0  | 1  | 1  | 1  | 0  | 0  |
| 5 | 0  | 0  | 0  | 0  | 1  | 1  | 1  | 1  |

The table shows how the S bits settle to 1 from MSB to LSB.

In the above-described U.S. Pat. No. 5,179,578 in FIG. 1, the Cin and Sin inputs are individually latched (stored), before being fed to the AND gate of the half-adders, for the generation of the carry Cout and to the XOR gate of the half-adder, for the generation of sum Sout.

The present patent however takes advantage the differential signals of the master-slave latches 80, 86 and 82, 84 to generate the Sum and Carry signals using common intermediate logical terms.

Latches generally provide differential signals, i.e. both non-inverted and inverted output signals. For example, an 2-input OR gate provides outputs

Q=D1 OR D2

XQ=NOT(D1 OR D2).

In high-speed logic families like current switching logic, it is easy to increase the fan-in of gates, as known in the art. The simplest example is the N-input OR/XOR ECL gate (Emitter-Coupled Logic) with N parallel input transistors.

The basic building block of this clocked circuitry with half-adding function is the simple latch with two inputs performing the function D1 OR D2.

For this approach, it is necessary to transform the generation of Sum and Carry into a form, which is compatible with OR/NOR logic. Using de Morgan's Law of Duality, one can write:

Sout = Cin AND Sin

= NOT(XCin OR XSin)

Cout = Cin EXOR Sin

= NOT(NOT(XCin OR Xcin)OR NOT(Cin OR Sin))

The required intermediate logic terms are thus readily obtained at the output of the master latches 80, 86 and the output of the slave latches 82, 84 contain the wanted expressions for Sum and Carry.

FIG. 7 shows the ECL realization of a simple latch 60 of FIG. 4, except for the double inputs D1 and D2 which are also shown in latches 80, 82 or 84 in FIG. 5. The function of FIG. 7 is as follows.

When CLK is high, the constant current Ibias generated in the bias circuit 98 is steered to the left side of the latch 90. D1 and D2 are the data input signals.

The transistor 103 has its base connected to the reference voltage Vref. This reference voltage has a mid-value between the high voltage and the low voltage of the input voltages in putted to D1 or D2. The voltage Vref is a threshold value used to decide whether D1 and D2 are at high or at low level.

When transistor 103 opens, the voltage at the node 96 drops from VDD to (VDD−(R*Ibias)). The resistance value of resistor 107 is identical to the one of resistor 106.

When at least one of the inputs D1 (base of transistor 101) or D2 (base of transistor 102) is high, the current will flow through the left resistor 106. Therefore, the voltage at the node 94 drops form VDD to (VDD−(R*Ibias)) and produce a low level. Because no current is flowing through resistor 107, a high level is generated for Q 96. Thus the logic operation of the circuit is equivalent to Q=D1 OR D2.

Transistors 104 and 105 serve to store the potentials of nodes 94 and 96 when the clock switches from high to low. When CLK has a "low" potential, the bias current flows through the right branch of the circuit. The values of Q and XQ, which are generated before, are then stored by the positive feedback of the cross-coupled transistors 104 and 105.

The present invention is not limited to these specific embodiments, but various variations and modifications may be made without departing from the disclosure of the present invention.

The invention claimed is:

1. A frequency divider using half-adding functions, comprising:

a plurality of latch circuits performing a half adding function, one latch circuit being provided for each of a plurality of bits, each latch circuit having a sum input, a carry input, a sum output and a carry output, wherein the sum output of each latch circuit is input to the sum input of the same latch circuit, the latch circuit for a least significant bit of the plurality of bits receives a "1" at the carry input thereof, and each of the other latch circuits receives, at the carry input thereof, a carry signal output from the carry output of the latch circuit of the next lower bit position; and AND gate circuitry receiving the sum outputs of the latch circuits, wherein the frequency of the frequency divider is lower bounded only by one latch circuit and the AND circuitry.

2. The frequency divider according to claim 1, wherein the AND gate circuitry consists of cascaded gates.

3. A frequency divider using half-adding functions, comprising:

a plurality of latch circuits performing a half adding function, one latch circuit being provided for each of a plurality of bits, each latch circuit having a sum input, a carry input, a sum output and a carry output, wherein the sum output of each latch circuit is input to the sum input of the same latch circuit, the latch circuit for a least significant bit of the plurality of bits receives a "1" at the carry input thereof, and each of the other latch circuits receives, at the carry input thereof, a carry signal output from the carry output of the latch circuit of the next lower bit position; and AND gate circuitry receiving the sum outputs of the latch circuits, wherein each latch circuit comprises a first and a second clocked master-slave latch, each including a master latch and a slave latch, the master latch of each master-slave latch having two signal inputs wired to perform an OR function and one clock input, the first slave latch having one signal input and one clock input, the second slave latch having two signal inputs wired to perform an OR function and one clock input, wherein one of the signal inputs of the second slave latch is connected with an inverting output of the first master latch and the other of the signal inputs of the second slave latch is connected with an inverting output of the second master latch.

4. The frequency divider according to claim 3, wherein a non-inverting output of the first master latch is connected to the signal input of the first slave latch, and the clock input of the first master latch and the second slave latch receive an inverted clock.

5. The frequency divider according to claim 4, wherein the two signal inputs of the second master latch receive a first signal and a second signal, respectively, and the two signal inputs of the first master latch receive the inverse of the first signal and the inverse of the second signal, respectively.

6. The frequency divider according to claim 3, wherein said master-slave latches are synchronous latches.

7. The frequency divider according to claim 3, wherein some or all of the latch circuits are transparent latches.

* * * * *